United States Patent

Brewster et al.

[11] Patent Number: 5,952,817
[45] Date of Patent: Sep. 14, 1999

[54] APPARATUS AND METHOD USING WAVEFORM SHAPING FOR REDUCING HIGH FREQUENCY NOISE FROM SWITCHING INDUCTIVE LOADS

[75] Inventors: Richard A. Brewster, West Boylston, Mass.; Carl T. Nelson, San Jose, Calif.

[73] Assignee: Linear Technology Corporation, Milpitas, Calif.

[21] Appl. No.: 08/840,017

[22] Filed: Apr. 24, 1997

[51] Int. Cl.[6] .................................. G05F 1/40; H02T 1/10
[52] U.S. Cl. ........................ 323/268; 323/271; 323/285; 307/24
[58] Field of Search ................ 363/39; 323/222, 323/271, 285, 282, 288, 268; 307/24; 318/254, 138, 439

[56] References Cited

U.S. PATENT DOCUMENTS

| | | | |
|---|---|---|---|
| 4,633,150 | 12/1986 | Inaji et al. | 318/254 |
| 4,823,070 | 4/1989 | Nelson | 323/285 |
| 5,191,269 | 3/1993 | Carobolante | 318/254 |
| 5,196,771 | 3/1993 | Naito | 318/254 |
| 5,614,797 | 3/1997 | Carobolante | 318/432 |
| 5,708,379 | 1/1998 | Yosinski | 363/74 |
| 5,731,692 | 3/1998 | Garcia | 323/274 |

OTHER PUBLICATIONS

Type 535A–545A Cathode Ray Oscilloscope Instruction Manual, Tektronix, Inc., pp. 4–19 to 4–20 (1960).
Type 453 Oscilloscope Instruction Manual, Tektronix, Inc., pp. 3–16 to 3–17 (1965).
Kenneth Arthur, *Power Supply Circuits*, pp. 115–123 (1969).
Type 7704A Oscilloscope Instruction Manual, Tektronix, Inc., pp. 2–34 to 2–37 (1973).
"Design DC–DC Converters To Catch Noise At The Source," *Electronic Design*, pp. 229–234 (Oct. 15, 1981).
"Conversion Techniques Adapt Voltages To Your Needs," *EDN*, pp. 155–168 (Nov. 10, 1982).
Application Note 29, Linear Technology (Oct. 1988).

*Primary Examiner*—Peter S. Wong
*Assistant Examiner*—Rajnikant B. Patel
*Attorney, Agent, or Firm*—Fish & Neave; Robert W. Morris

[57] ABSTRACT

A low-noise switching regulator and a method for driving an inductive load, employing current slew control and voltage slew control, is provided. Open and closed loop embodiments, as well as first and higher order slewing, are also provided.

19 Claims, 14 Drawing Sheets

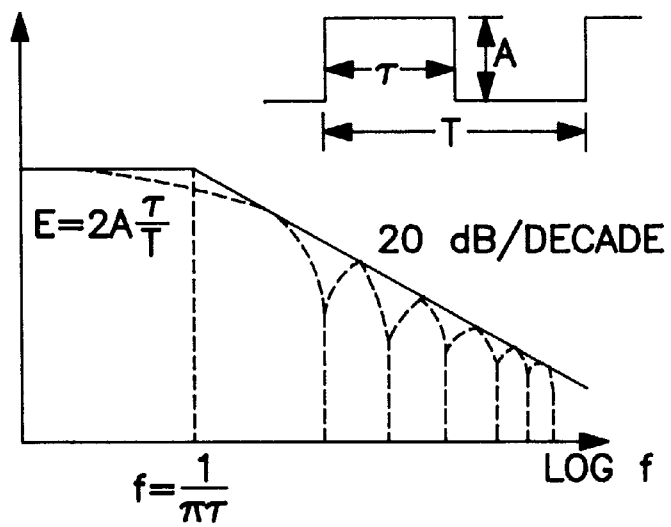
FIG. IA
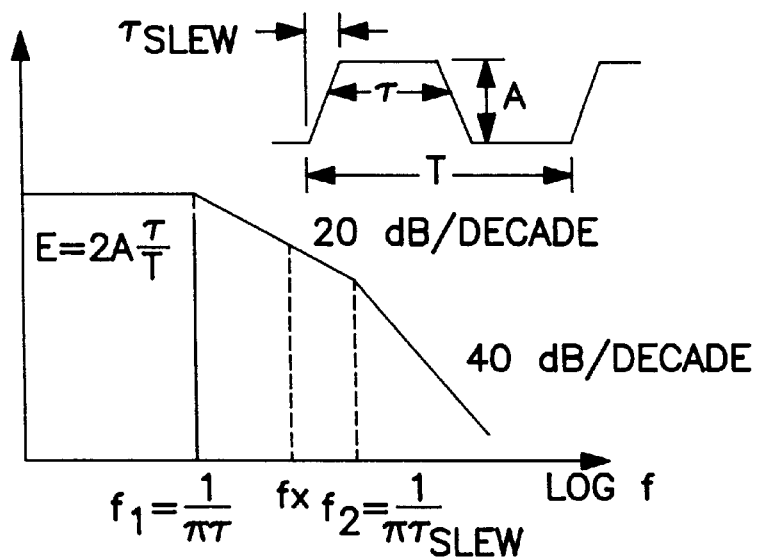
FIG. IB

APPARATUS AND METHOD USING WAVEFORM SHAPING FOR REDUCING HIGH FREQUENCY NOISE FROM SWITCHING INDUCTIVE LOADS

BACKGROUND OF THE INVENTION

This invention relates to an apparatus and a method for using waveform shaping to reduce high frequency noise from switching (also referred to as "driving") inductive loads and, more particularly, using current slew control and voltage slew control, where "slew" refers to the slope (or rate of change) of a waveform.

An increasingly important issue in the design of electric products is high frequency electromagnetic noise. This noise can reduce product performance or cause interference with other products. Tremendous energy and cost are spent trying to eliminate the source and reduce the effects of the noise. Switching currents and voltages in electric devices such as motors, solenoids and switching regulators are sources of noise that are omnipresent. New products, such as cellular telephones, require ever lower levels of both conducted and radiated electromagnetic noise in order to operate properly. There is also increased legislation regarding containment of electromagnetic pollution. European emission and susceptibility standards are a case in point.

Sharp transitions in a waveform contain greater high frequency components. This can be shown mathematically through Fourier series and transforms. For instance, a pure sine wave has a single frequency component and a square wave has a large number of high frequency components whose amplitude decrease with frequency. Reducing high frequency content means reducing the sharpness of the transitions.

FIG. 1 shows a simple rule of thumb regarding high frequency components. In a square wave, the high frequency components decrease in magnitude from the fundamental frequency $$\frac{1}{\pi \cdot \text{on-time}}$$

at a 20 db/decade rate, where "on-time" is the time when the switch conducts current.

A waveform with slewed edges is a waveform with transitions of nearly constant slope, i.e., a ramped signal. This means that the first derivative of the waveform is controlled. Often, waveforms with slewed edges have rounded corners. In a waveform with slewed edges and a constant first derivative, the high frequency components roll off at 20 db/decade from the fundamental frequency and at 40 db/decade from a frequency equal to $$\frac{1}{\pi \cdot t_{slew}}$$

where $t_{slew}$ is the transition time of the slewed edge.

Radiation from electric devices can usually be considered in terms of the dominant electromagnetic field, which is either electric or magnetic. Either type of field can introduce noise into circuits. Electric field radiation is caused by changes in voltage. Magnetic field radiation is caused by changes in current. Countermeasures often involve both reducing the source of the radiation as well as shielding receiving circuits.

Reducing electric field induced noise can be accomplished by slowing voltage transitions with elements like capacitors. Reducing coupling capacitances can lessen the strength of noise at the receiving end. This is done with metal enclosures and metal shielding of components, wires and printed circuit board traces.

Containing magnetic field induced noise is more difficult. Reducing the source strength involves slowing down current transitions. Often this is done by adding inductive elements which are usually more expensive than capacitive elements. Shielding receiving elements from magnetic field induced noise requires a special and often expensive mu-metal shield. Since magnetic field induced noise can induce current in nearby printed circuit board traces, it is often difficult to provide a complete shield.

Some switching regulator topologies integrate high frequency filter elements with power components which can help to reduce the cost. However, such topologies still often add specific components to reduce emissions.

Adding external components necessarily increases system cost so it is desirable to minimize their number. Such external components are usually added to slow the rate of change in current and/or voltage. This can be done either by diverting high frequency components after they are created (adding a filter) or by minimizing their creation. Often because the currents are large, there is an associated power loss due to the filtering.

Controlling the voltage slew (dv/dt) across an inductor is sometimes done by creating a filter. Adding capacitance to the switching node slows the voltage transition and absorbs high frequency components. However, because of the high currents involved, the capacitor may be physically large and can dissipate substantial power, reducing switching efficiency.

Switching regulators are highly desirable because of their conversion efficiency. However this efficiency comes at the expense of creating current and voltage waveforms with greater high frequency electromagnetic content. This high frequency noise couples to nearby circuitry either through conduction or radiative electromagnetic coupling (capacitive and inductive). Switching regulator designers are often forced to compromise between efficiency, noise and performance.

In a switching regulator, most electromagnetic interference is generated by: 1) abrupt changes in current through the inductor which create high frequency magnetic noise and induce changes on nearby lines; 2) changes in inductor current which create abrupt voltage changes through equivalent series resistance ("ESR") and equivalent series inductance ("ESL") in decoupling capacitors; 3) abrupt voltage changes on an output switching element which capacitively couple to ground, introducing transient currents onto power lines; and 4) turn-off of diodes which produces sharp current transients, produces high frequency magnetic noise and also may produce high frequency voltage transients through capacitor ESR.

The interfering noise is introduced into other circuitry through conduction in power and ground wires and by capacitive or magnetic radiative coupling from "hot" components to other circuitry. Typically, conducted noise is more of a problem for the lower frequencies while radiated noise is more of a problem for higher frequencies. For a switching regulator, the current in the inductor or transformer and the currents in the switching elements are usually the most troublesome sources of noise because they are the largest currents. Likewise, voltage excursions in switching regulator switches are often the greatest source of noise due to the speed of transition and connection to the power path.

In view of the foregoing, it would be desirable to provide an apparatus and a method for reducing high frequency noise components caused by switching an inductive load, without sacrificing circuit performance or adding additional components.

It would also be desirable to allow more control over the tradeoff between harmonic content and conversion efficiency.

SUMMARY OF THE INVENTION

It is an object of the present invention to provide an apparatus and a method for reducing high frequency noise components caused by switching an inductive load, without sacrificing circuit performance or adding additional components.

It is also an object to allow more control over the tradeoff between harmonic content and conversion efficiency.

These and other objects are accomplished by switching the inductive load using a drive voltage supply, the load coupled between a signal node and an output node, by slewing the output node voltage and slewing the signal node current.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 1 illustrates the frequency content of a signal waveform as a function of the sharpness of the signal waveform edges (from Mark Nave, "Prediction of Conducted Emissions in Switched Mode Power Supplies," 1986 *IEEE International Symposium on Electromagnetic Compatibility*, page 173);

DETAILED DESCRIPTION OF THE INVENTION

The present invention is an apparatus and a method for reducing noise caused by high frequency electric and magnetic noise from switching inductive loads.

The present invention enables a switching regulator controller to be modified to reduce electric and magnetic frequency harmonics economically while, at the same time, allowing more control over the tradeoff between harmonic content and conversion efficiency. Since most of the circuitry called for by the invention can be incorporated into an integrated controller, overall system costs can also be reduced.

The harmonics are reduced by controlling the slew rates of both voltage and current in the switching regulator, thereby decreasing the need for large power handling filter components. This is done by reducing the abrupt changes of voltage and current in power components. In one embodiment, the output switching element has both voltage and current slewed by means of feedback control loops that are integrated into the controller.

Figure 2:
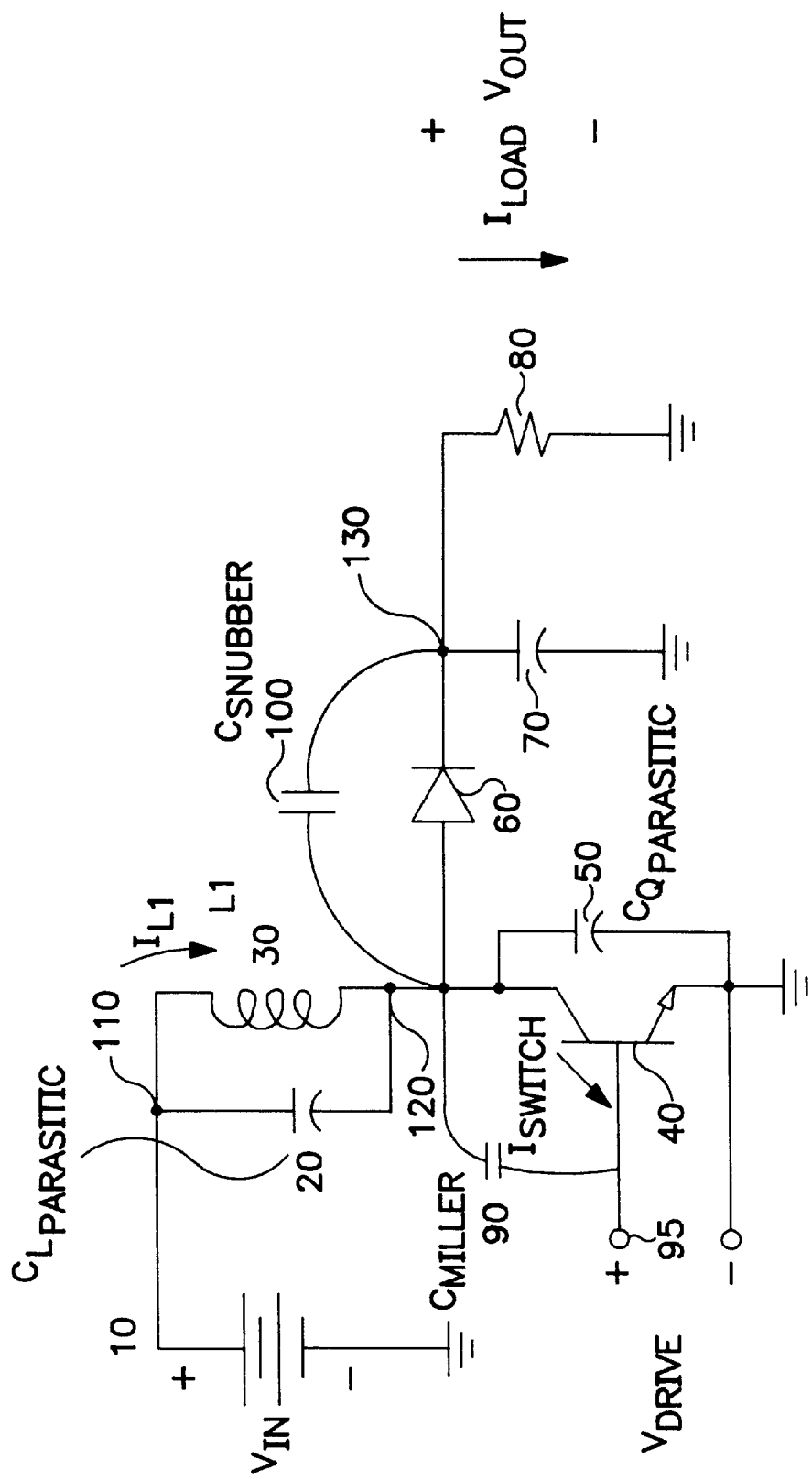
FIG. 2 shows a prior art boost switching regulator circuit.

FIG. 2 shows a prior art boost (also referred to as "step-up") switching regulator circuit without controller driven by drive voltage $V_{drive}$ applied to drive node 95. Inductor current $I_L$, ramps up when transistor 40 conducts (node 120 near ground). When transistor 40 is turned off, the voltage at node 120 rises rapidly as inductor 30 attempts to maintain constant current. Diode 60 turns on, and inductor 30 dumps current into capacitor 70. The main concern with diode 60 is its current transition (radiated magnetic field). Diode 60 turns off when transistor 40 turns on. The abrupt turn-off of the diode produces a sharp current slew (di/dt) into the output. This is sometimes addressed by the use of a Schottky diode or by putting a snubber 100 across diode 60. Output voltage $V_{out}$ can be much larger than input voltage $V_{in}$. Also shown are parasitic capacitances 20 and 50.

Input common mode noise is defined as voltage or current that occurs in phase on both the supply line ($V_{in}$) and return line (signal ground), i.e. both move the same way with respect to earth ground. Input differential mode noise is caused by differences in supply line and return line voltage values. Input common mode noise tends to be caused by voltage excursions of the switch and parasitic capacitances. Input differential mode noise tends to be caused by inductor currents acting on the impedance of the input capacitor (i.e, a capacitor placed on the input voltage line to filter noise coming from the source supply). Controlling dv/dt helps to reduce input common mode noise. Controlling di/dt helps to reduce input differential mode noise.

Switching regulator circuits, such as the one shown in FIG. 2, reduce input common mode noise by slewing the output of the switch (i.e., by providing the output with a substantially linearly increasing output voltage). As shown in FIG. 2, Miller capacitor 90 with capacitance $C_{miller}$ is placed between collector and base of transistor 40 to control the voltage slew (dv/dt) when transistor 40 operates in the linear range. Because of the Miller effect, the feedback through Miller capacitor 90 causes the input capacitance of transistor 40 to increase to $C_{miller} \cdot (G_Q+1)$, where $G_Q$ is the gain of transistor 40. However, Miller capacitor 90 requires access to the input base or gate of transistor 40. Depending on the circuit, this may require that the capacitance of external Miller capacitor 90 be large. Normally, capacitance decreases with voltage for a bipolar transistor. Since Miller capacitor 90 is in parallel with the collector to base capacitance of transistor 40, it either has to be large enough to dominate the collector to base capacitance or change such that the total capacitance remains constant Therefore, it may be difficult to easily adjust the voltage slew (dv/dt) for fine tuning. Miller capacitor 90 is a feedback element that, depending on the load and drive conditions, may produce undesirable oscillations.

Figure 4A:
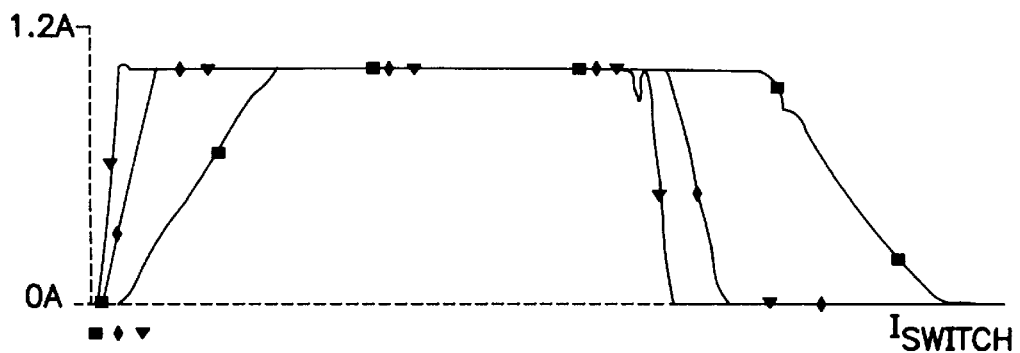
FIG. 4 shows representative waveforms corresponding to the flow diagram of FIG. 3.
Figure 4B:
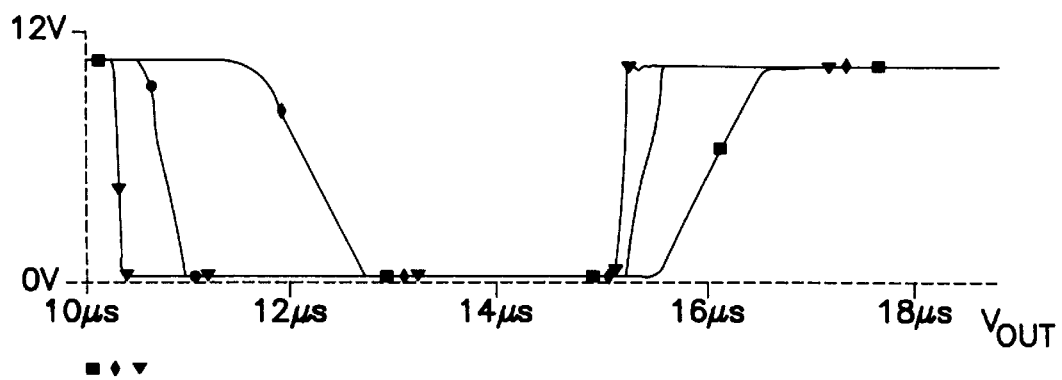

One might expect that using Miller capacitor 90 would also ramp (i.e., cause to increase in substantially linear fashion) output current $I_L$. However, since, as shown in FIG. 4, output voltage $V_{out}$ changes at a different time than the major change in inductor current $I_{L1}$ (approximately equal to $I_{load}$ in FIG. 4), Miller capacitor 90 has little effect on output current. This is because most of the current does not divert to diode 60 until the time the voltage change has occurred. Output voltage $V_{out}$ ramps up, turning on diode 60 which diverts the current and then clamping diode 60.

Another way that noise can be introduced into the output is by capacitive coupling from the switching node. Again, slewing this node reduces this kind of noise. One way that voltage slew (dv/dt) is controlled (other than a Miller cap) is by ramping the input to the driver. An example of voltage slew control is shown in Linear Technology Application Note 29.

The following discussion uses a switching regulator as an example but the invention is not limited to a switching regulator, which is but one device in which the invention may be embodied. This invention is applicable to other inductive load switching situations. Examples include motors (for instance, in a disk drive), impact printer printing pins, relays, solenoids (such as mechanical actuators and automotive fuel injector solenoids) and phased array radar waveguide adjusters.

Conducted output noise of a switching regulator circuit depends on many factors. Circuit topology has a big influence on noise but often a predominant effect is the switching of the current onto the output capacitor. This current acting through the ESR of the capacitor can create sharp voltage steps. Therefore, reducing the sharpness of the current transition reduces this problem.

A common solution to the output noise problem is to add additional filtering elements. Again, reducing the source of this output noise allows us to eliminate or reduce the need for such filtering elements.

A switching inductor can introduce noise into a system in several ways. The first is by magnetic radiation of the component itself which depends on the current in the device. Current can also cause noise problems by acting on decoupling components, such as the voltage created in the ESR of a decoupling capacitor due to the current in the inductor. Another way is large voltage change. An example of a large voltage change would be the voltage "flyback" that is created when the current in an inductor changes suddenly. Thus, it is desirable to reduce the high frequency content of inductor current. As discussed above, high frequency content is controlled by current slew. For an inductor, the current slew (di/dt) is proportional to the voltage across the inductor, as shown below:

$$v = L \cdot \frac{di}{dt}$$

The value of the voltage applied across the inductor is often a result of circuit topology. Voltage can be controlled by supply voltages, transformer action and clamps (such as zeners or snubbers). So, by limiting voltage, topology can control slew to a first order and, therefore, the first order high frequency components of an inductor's current.

In a switching regulator, increased conversion efficiency is obtained by reducing power losses in the switching element. Current in an inductor does not change instantaneously, however voltage can change nearly instantaneously. When switching an inductor, one is usually switching between a clamp voltage and an on-state voltage. This places an approximate square wave voltage across the inductor.

Switching regulators may be operated in one of two modes, continuous inductor current or discontinuous inductor current. In continuous mode, the current waveform is almost triangular with current slew controlled by voltage. In discontinuous mode, the current waveform is almost trapezoidal. The driving voltage is defined as the voltage across an inductor when the inductor is on. In either case, current slew is controlled by driving voltages.

A principal concern with switching element 40 is that output voltage slew (dv/dt) will couple through parasitic capacitance 50 ($C_{Q_{parasitic}}$) to ground producing input common mode noise. The transitions on the switching element are typically abrupt. In fact, in the continuous mode of operation, the transitions are almost a step function with transition times limited only by device turn-on or turn-off.

Figure 5:
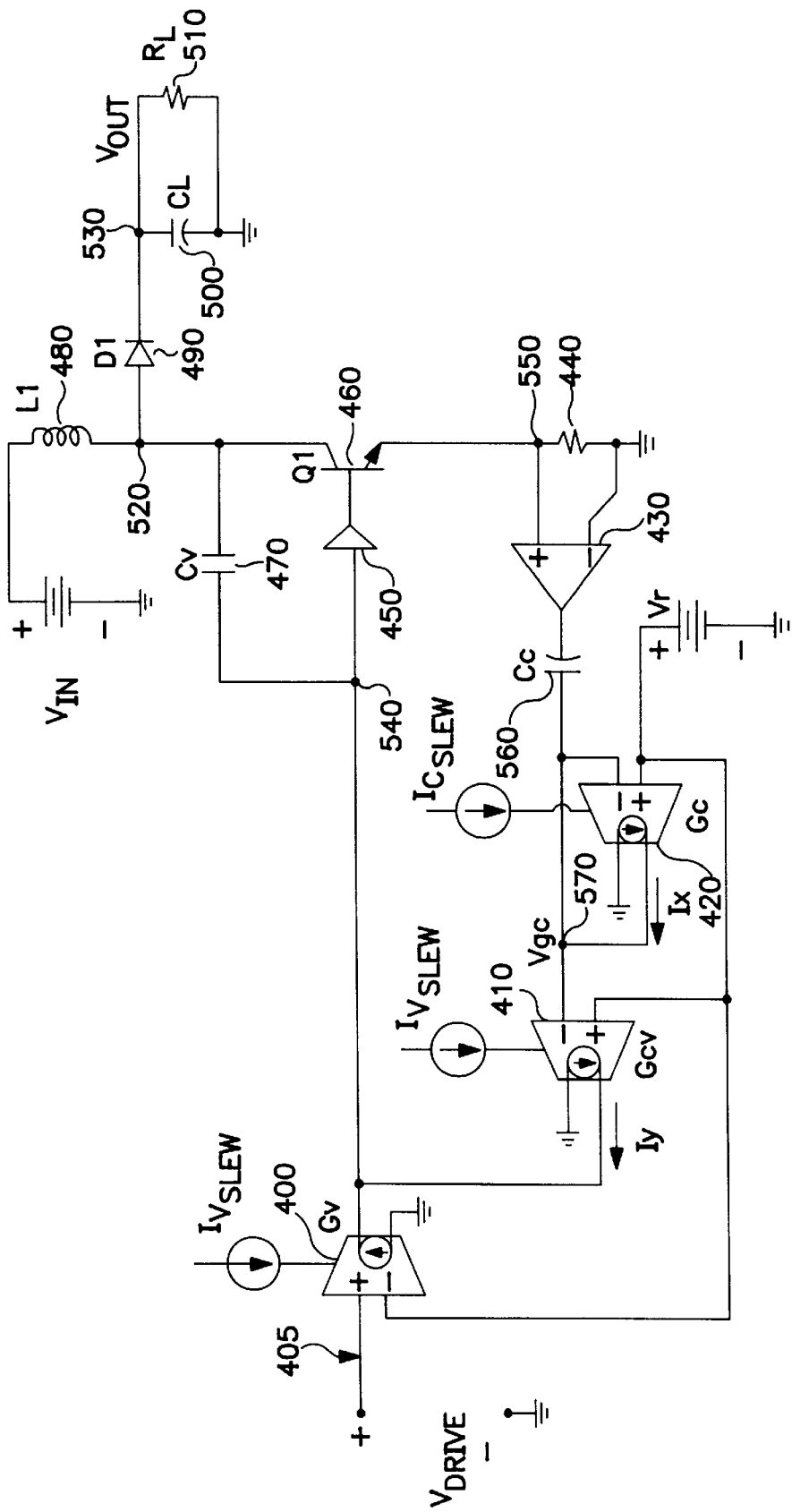
FIG. 5 shows an embodiment of a slew control circuit.

The present invention controls switch dv/dt using a similar Miller capacitor that reduces input common mode noise. By integrating capacitive feedback into the output stage design, the amount of feedback is easily adjustable by the user and not as prone to oscillations. The invention also ties voltage slew (dv/dt) and current slew (di/dt) together by summing voltage feedback and current feedback at node 540, as shown in FIG. 5.

The embodiments of the present invention shown in FIGS. 3, 5, 6 and 8 attempt to control slew rates (voltage or current) such that the derivative of the changing output (voltage or current) is constant (i.e., constant slew causing the output to linearly ramp).

By controlling the current slew (di/dt) of the switching element, it is possible to reduce transients (and thus high frequency content) caused by abrupt current change in the switching element that otherwise might couple through the power connection to the switching element.

Controlling the current in the switching element (for example, $Q_{switch}$ above) also controls current in diode 60. As long as other parasitic elements are not too large, this is simply a result of Kirchoff's law. This implies that we can control the switching element current slew (di/dt) and automatically take care of the diode current slew (di/dt).

Figure 3:
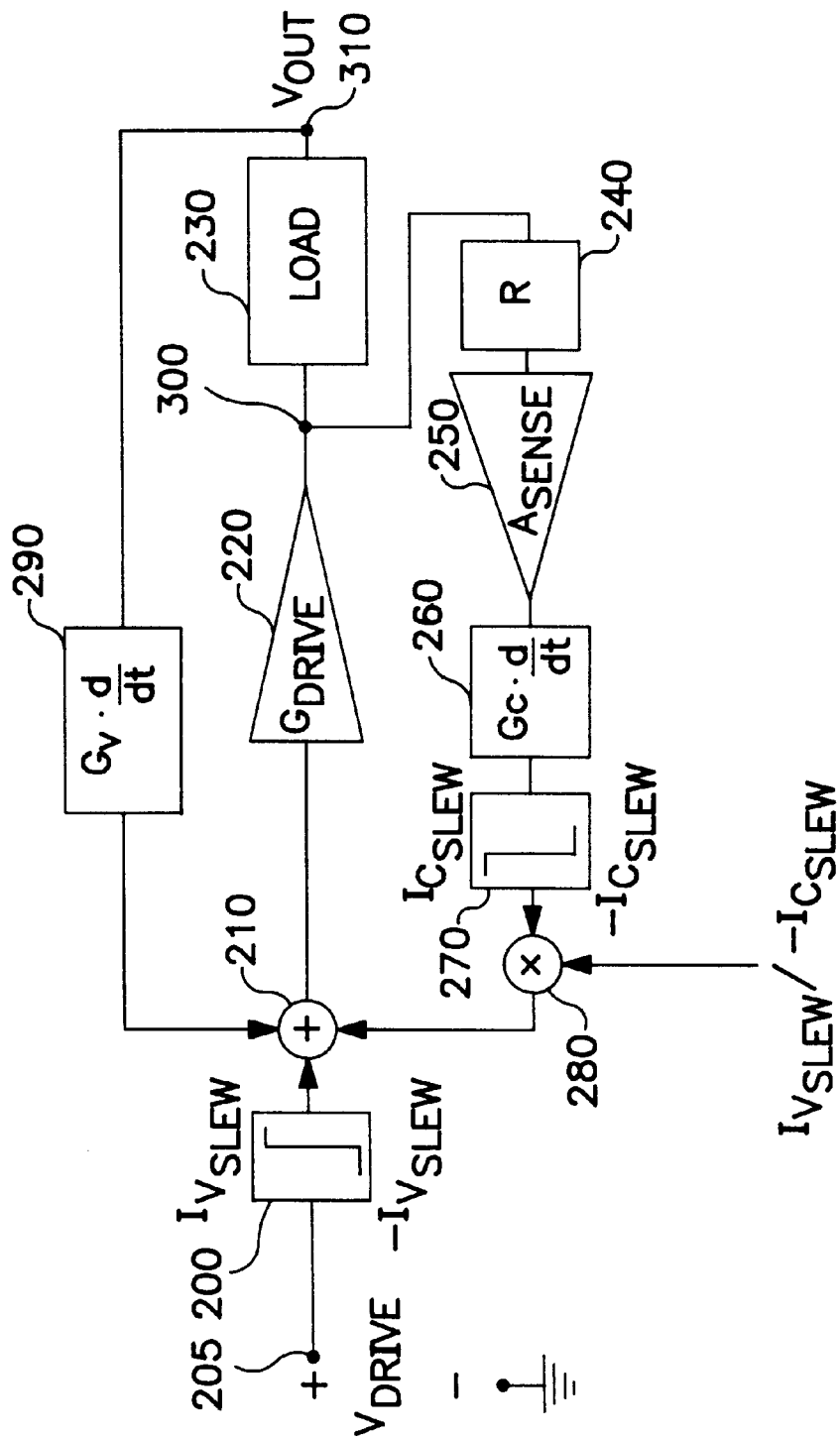
FIG. 3 is a flow diagram which illustrates current and voltage slew control.
Figure 13:
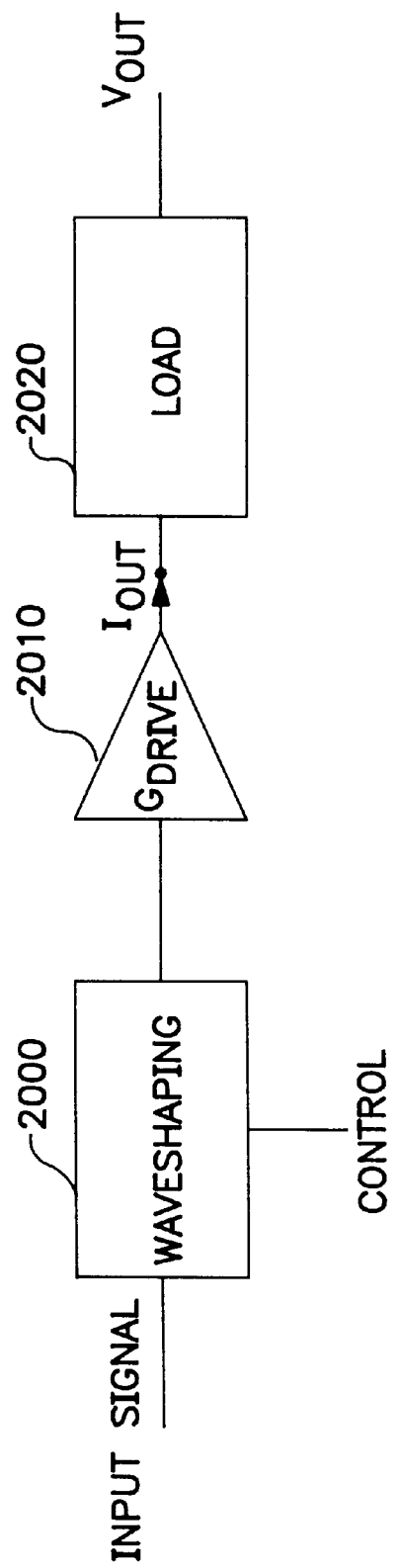
FIG. 13 shows an open loop slew control circuit.

In another embodiment, increased reduction of high frequency signal components can be obtained by controlling higher order derivatives of the signal. For these waveforms, not only is the first derivative finite and controlled, but higher order derivatives are finite and controlled, thereby eliminating abrupt transitions in the waveforms. One way of doing this is by creating differential feedback filters in a dual feedback loop method, as shown in FIG. 3, for example. Another way is to generate a waveform such as a tanh (hyperbolic tangent) shaped waveform in an open loop system, as shown in FIG. 13.

As shown above with reference to FIG. 2, control of high frequency harmonics requires control of output switching element voltage slew (dv/dt) and current slew (di/dt). As shown in FIG. 4, when controlling output voltage and current during turn-on, switching element current $I_{switch}$ (the current in the collector of switching element 40) initially builds until it is nearly equal to the inductor current $I_{L1}$ at which point the output voltage $V_{out}$ then falls. When diode 60 conducts, output voltage $V_{out}$ tracks switching element 40 collector voltage and differs only by the de minimis drop across diode 60. During turn-off, output voltage $V_{out}$ increases and then output current $I_{load}$ drops. Many circuits for controlling waveforms do not allow for control of all these transitions. The present invention is the first circuit to do this.

The present invention allows for independent control of both output voltage and switching element current transitions. This is done by having two interlinked feedback paths: one for current and one for voltage.

The following description is based on a closed loop control system, a slew control circuit, as shown in FIG. 3. The present invention is, of course, applicable to an open loop control system, whereby a correctly shaped waveform is amplified and used to drive the output, as shown in FIG. 13. To provide a given output current and voltage in an open loop system, knowledge about the load (e.g., the loads impedance characteristics) is necessary to design the drive to the output stage.

As shown in FIG. 3, inductive load 230 is driven by drive voltage $V_{drive}$ applied to drive node 205. Signal node 300 current $I_{out}$ flows through load 230, which is coupled between signal node 300 and output node 310. Output node 310 voltage $V_{out}$ is differentiated by differentiating amplifier 290 (gain $G_V$) to generate a first feedback signal which is applied to an input terminal of summer 210 and used to control the slew of $V_{out}$. Signal node current $I_{out}$ is transformed by resistor 240 to a voltage signal, amplified by sense amplifier 250 (gain $A_{sense}$), differentiated by differentiating amplifier 260 (gain $G_c$), limited to a magnitude of $I_{c_{slew}}$ by limiter 270, and multiplied by a coefficient $I_{v_{slew}}/I_{c_{slew}}$ to generate a second feedback signal which is applied to an input terminal of summer 210 to control the slew of $I_{out}$. Currents $I_{c_{slew}}$, $I_{v_{slew}}$ are created by external resistors coupled to supply voltage $V_{in}$ which allows for user programmability. These resistors could be put on chip at fixed values or programmed electrically. Summer 210 combines the first and second feedback signals with drive voltage $V_{drive}$, whose magnitude has been limited to $I_{v_{slew}}$, to drive load 230 through drive amplifier 220 (of gain equal to $-G_{drive}$).

FIG. 5 shows a block diagram of a preferred embodiment which comprises two feedback loops. Drive voltage $V_{drive}$ is applied to the positive input terminal of transconductance amplifier 400. Transconductance amplifier 400 has its negative input terminal coupled to $V_r$ and is controlled by $I_{v_{slew}}$. Transconductance amplifier can also be thought of as a voltage controlled current switch that switches between sourcing $I_{v_{slew}}$ and sinking $I_{v_{slew}}$. Output buffer amplifier 450 is coupled between drive node 540 and the base of output switch 460. Output switch 460 may be a transistor, as shown in FIG. 5. In FIG. 5, the inductive load comprises inductor 480 coupled between $V_{in}$ and signal node 520; diode 490 coupled between signal node 520 and output node 530; capacitor 500 coupled between output node 530 and ground; and resistor 510 coupled between output node 530 and ground. $I_{c_{slew}}$ and $I_{v_{slew}}$ are currents created by resistors which may be adjusted for a given slew rate.

The first feedback loop of FIG. 5, the voltage slew control loop, comprises Miller capacitor 470 which is coupled between signal node 520 and drive node 540.

The second feedback loop of FIG. 5, the current slew control loop, comprises resistor 440 coupled between the emitter of transistor 460 at node 550 and ground; sense amplifier 430 coupled across resistor 440; capacitor 560 coupled between output terminal of sense amplifier 430 and current slew control feedback node 570; transconductance amplifier 420 controlled by $I_{c_{slew}}$ with negative input terminal coupled to current slew control feedback node 570, positive input terminal coupled to reference voltage $V_r$ and output terminal coupled to current slew control feedback node 570; and transconductance amplifier 410 controlled by $I_{v_{slew}}$ with negative input terminal coupled to current slew control feedback node 570, positive input terminal coupled to $V_r$ and output terminal coupled to drive node 540. For transconductance amplifier 420, output current $I_x = G_c \cdot (V_r - V_{gc})$. For transconductance amplifier 410, output current $I_y = G_{cv} \cdot (V_r - V_{gc})$. Therefore, $I_y = I_x \cdot G_{cv}/G_c$. When transconductance amplifiers 410 and 420 have limiting currents of $I_{v_{slew}}$ and $I_{c_{slew}}$, respectively, then $$I_y = A \cdot I_x \cdot \frac{I_{v_{slew}}}{I_{c_{slew}}}$$

where A represents an additional gain variable. This loop controls the current slew (di/dt) of output transistor 460, which acts as the switching element. During output current excursions, voltage $V_{gc}$ at current slew control feedback node 570 is slewed by means of the current outputs of $G_c$ and the capacitor $C_c$.

Because the two loops share the common drive node, both loops can interact with each other, allowing a smooth transition between voltage and current slewing.

The current $i_{c_{slew}}$, the capacitor $C_c$, the sense amplifier and sense resistor together control the current slew rate. The current $i_{v_{slew}}$, and the capacitor $C_v$ control the voltage slew rate. Approximate equations are:

$$\frac{dv_{out}}{dt} \cong \frac{i_{v_{slew}}}{C_v} \qquad \frac{di_{out}}{dt} \cong \frac{i_{c_{slew}}}{R_1 \cdot A_{sense} \cdot C_c}$$

Figure 6:
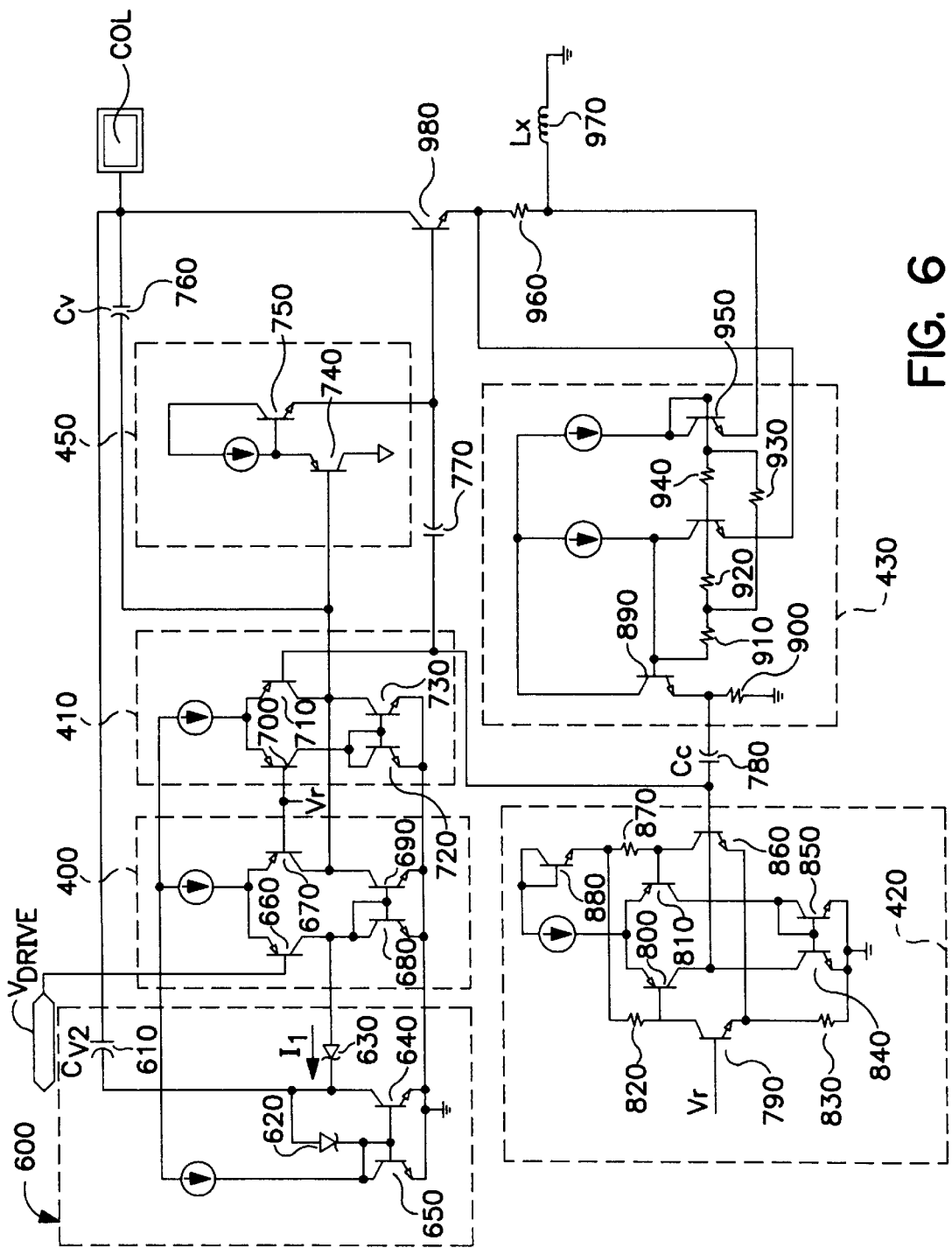
FIG. 6 shows a transistor level embodiment of the slew control circuit of FIG. 5.

One limitation of the circuit of FIG. 5 is the sudden clamping off of the output voltage by diode 490. Because of the speed at which this clamping off takes place, the current slew feedback loop must quickly take over from the voltage slew feedback loop for good control. FIG. 6 shows a possible transistor level embodiment of transconductance amplifier 400, transconductance amplifier 410, transconductance amplifier 420 and sense amplifier 430 of the slew control circuit of FIG. 5 and includes switch over circuit 600 to facilitate the change over from current slew feedback to voltage slew feedback and to compensate for the overlapping feedback loops and device limitations. Device limitations include finite transistor bandwidth and finite transistor gain.

During output turn off, transistor 690 sinks current. The positive voltage slew on the output creates a current through capacitors 610 and 760. Current from capacitor 610 stops flowing, causing the voltage on the collector of transistor 640 to fall from about two diode voltage drops above ground toward saturation. This then pulls current through diode 630 from transistor 660, diverting current from current mirror 680, 690. Thus, the output voltage slew diverts current from transistor 690 momentarily, preventing further output turnoff and allowing the current feedback loop time to respond.

FIG. 6 also includes capacitor 770 which helps invoke the current loop during turn-on of the output driver in order to pull the base of transistor 860 high during output driver turn on, thereby giving the current control loop time to respond and inductor 970 which helps to stabilize the current control loop during turn-off.

FIG. 7 illustrates representative waveforms corresponding to the circuit of FIG. 6 as a function of time. FIG. 7a shows the current in diode 630. FIG. 7b shows the current in capacitors 760 and 780. FIG. 7c shows the current in transconductance amplifier 400. FIG. 7d shows the current in transconductance amplifier 410. FIG. 7e shows the voltage at the output of transconductance amplifier 420. FIG. 7f shows the voltage at the output of sense amplifier 430. FIG.

Figure 7A:
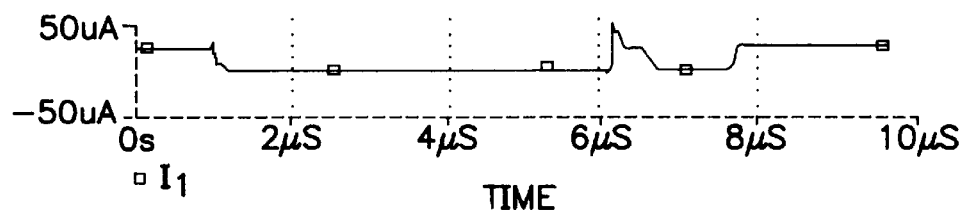
FIG. 7 shows representative waveforms corresponding to the circuit of FIG. 6.
Figure 7B:
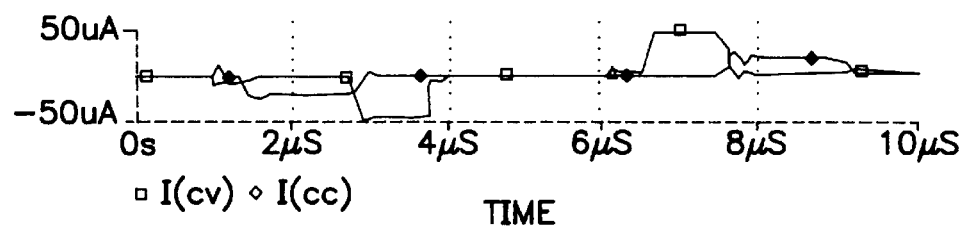
Figure 7C:
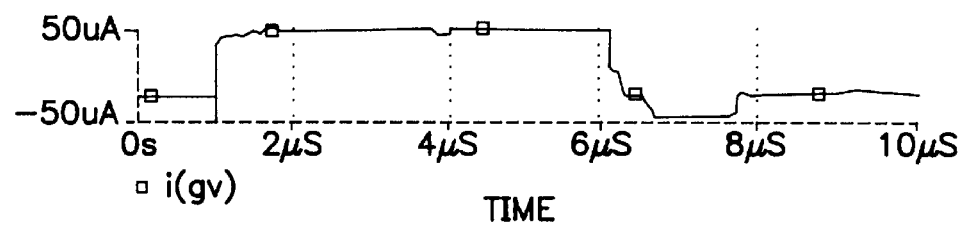
Figure 7D:
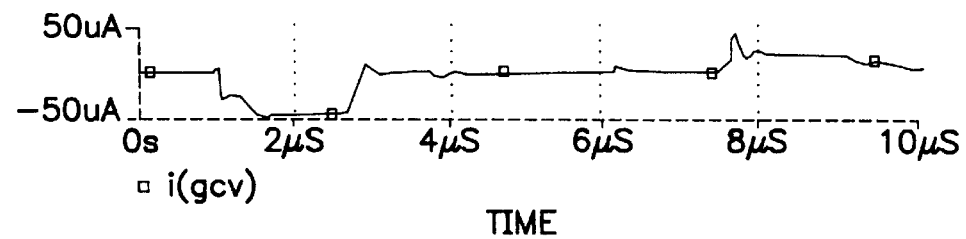
Figure 7E:
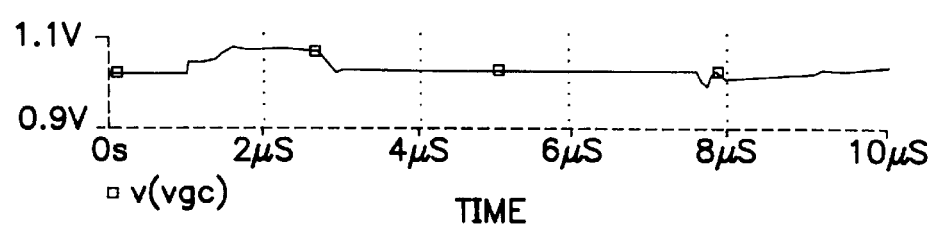
Figure 7F:
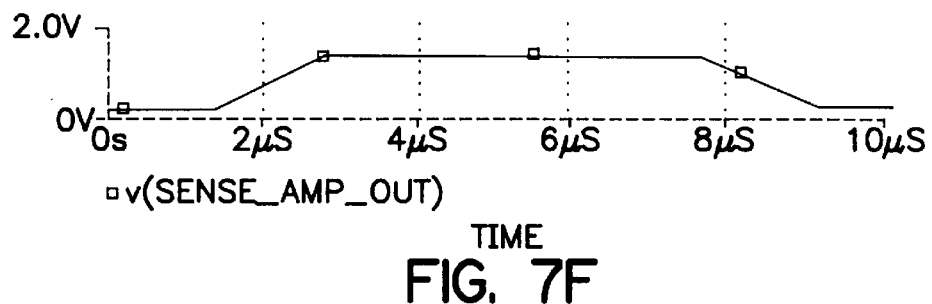
Figure 7G:
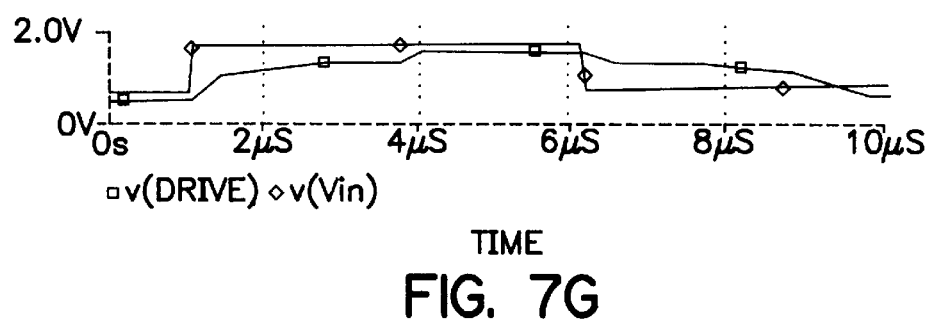
Figure 7H:
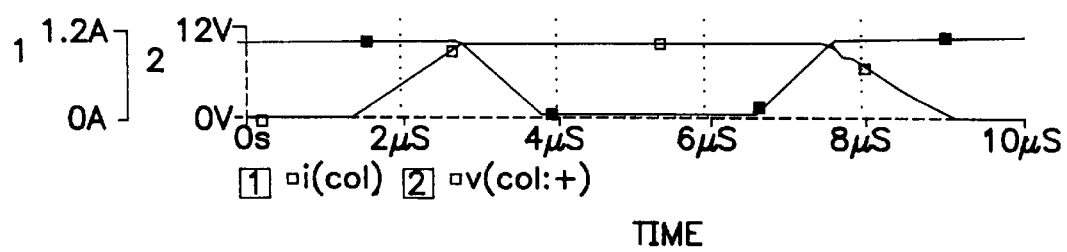

7g shows voltages $V_{drive}$ and $V_{in}$. FIG. 7h shows output current and output voltage.

One skilled in the art will easily recognize that a switched mode power supply controller employing output slew control with dual output terminals may be provided for use in push-pull applications. In such an embodiment, the sense amplifier and $G_c$ amplifier can be common (i.e., both outputs can share a single sense amplifier) with separate $G_v$, $G_{vc}$ amplifiers and drivers.

Figure 8:
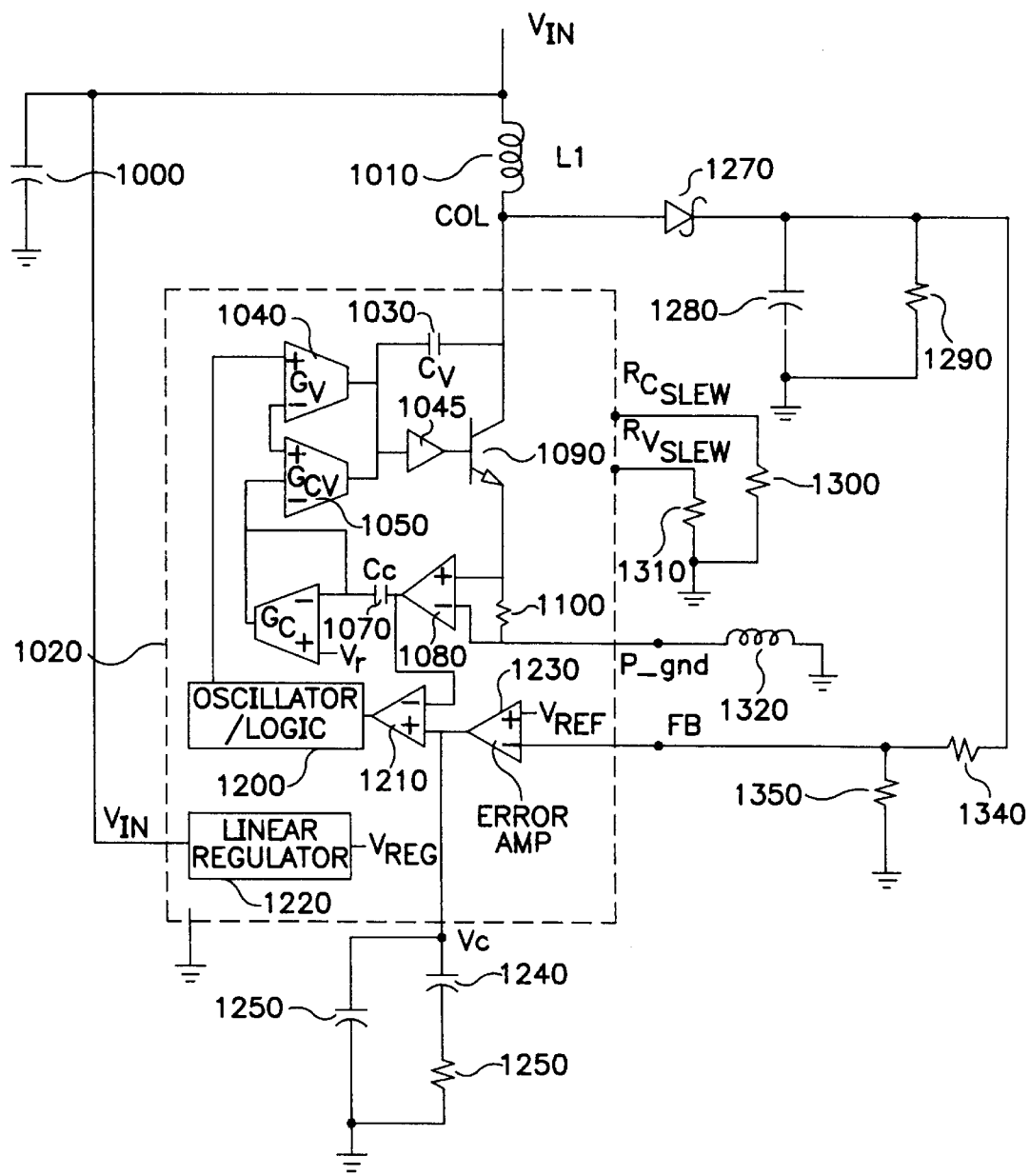
FIG. 8 is a block diagram of a complete switcher using output slew control.

A complete switcher is shown in FIG. 8. The complete switcher includes driver block 1020. Driver block 1020 may include a voltage regulator, such as low-dropout linear regulator 1220 to generate a regulated voltage $V_{reg}$. The complete switcher may also include decoupling capacitor 1000 as well as additional circuitry for adjusting voltage and current slew, such as resistors 1300 and 1310 connected to nodes $R_{Vslew}$ and $R_{Cslew}$ (nodes shown in FIG. 9). Further simplification of slew control in a switching regulator controller may be obtained by using information from output terminal of error amplifier and the feedback pin FB. It is desirable to have higher efficiency (faster slews) during startup. As the system starts to regulate, slew is increased by action of oscillator/logic block 1200, thereby quieting the system.

Figure 9:
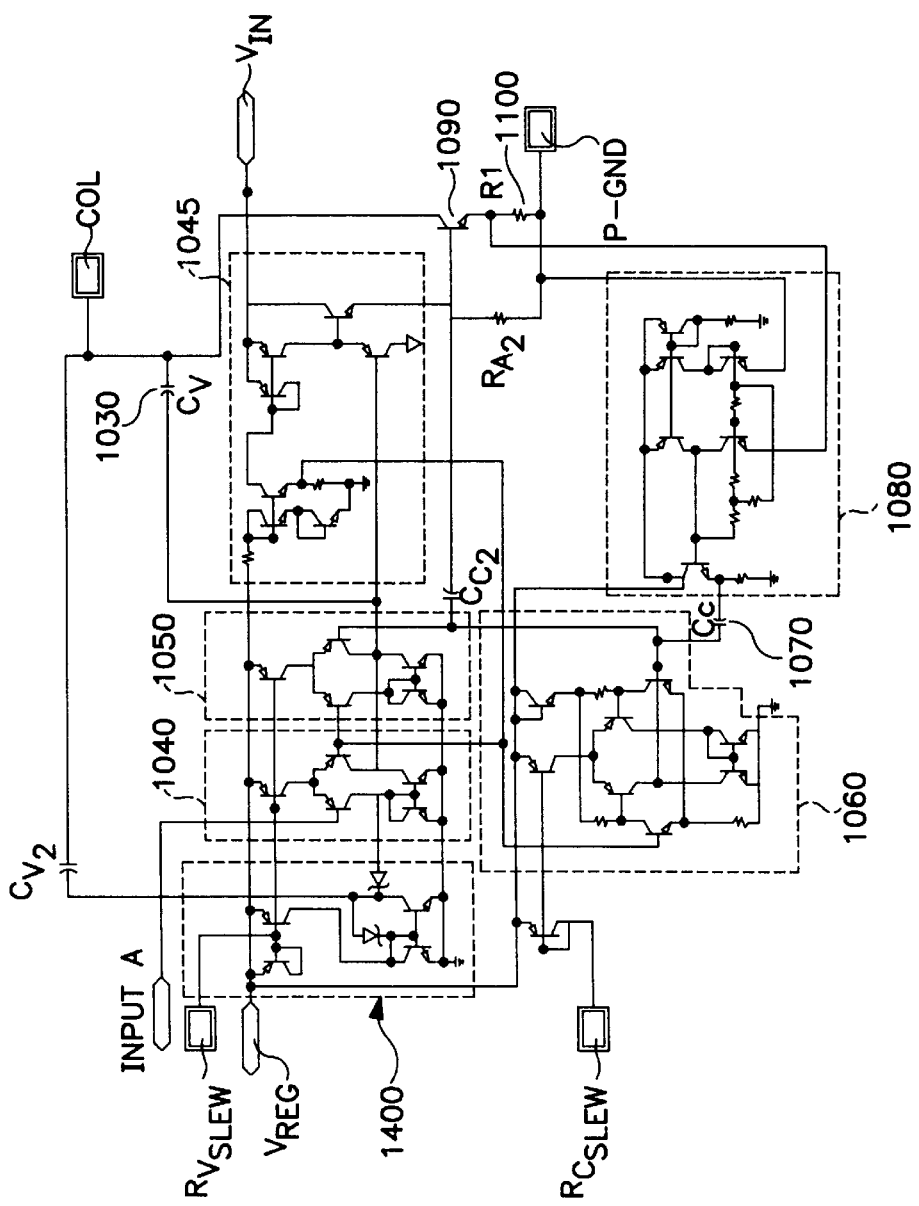
FIG. 9 shows a transistor level embodiment of the output driver block of FIG. 8.

FIG. 9 shows a possible transistor level embodiment of transconductance amplifier 1040, transconductance amplifier 1050, output buffer amplifier 1045 (including bias circuit), transconductance amplifier 1060 and sense amplifier 1080 of the complete switcher circuit of FIG. 8 and includes switch over circuit 1400 to facilitate the change over from current slew feedback to voltage slew feedback and to compensate for the overlapping feedback loops and device limitations.

Figure 10:
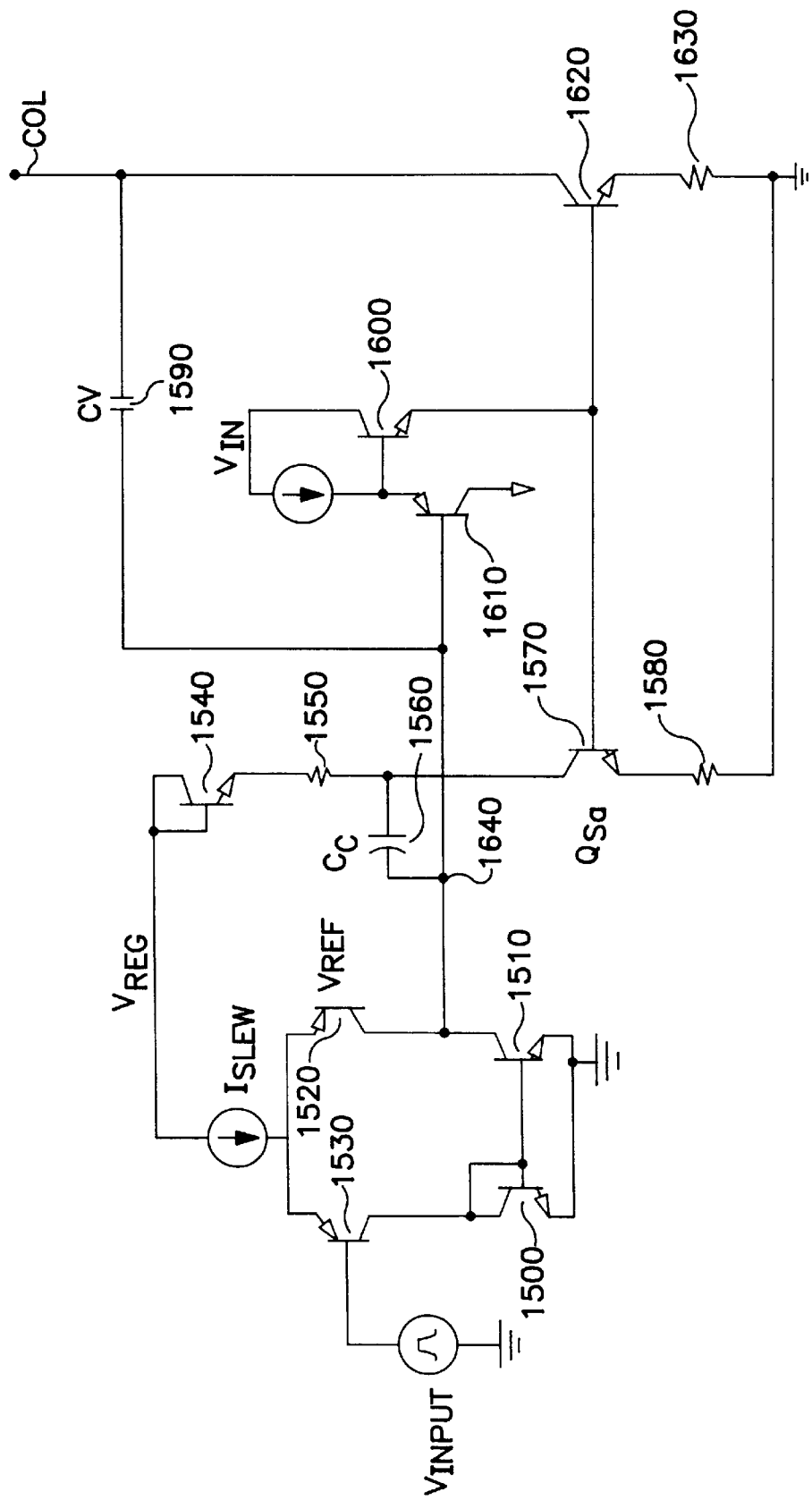
FIG. 10 shows a single control resistor embodiment of a switched mode power supply controller using output slew control.

Another embodiment of a slew control circuit is shown in FIG. 10. FIG. 10 is a single control resistor slew control circuit which corresponds to the circuit of FIG. 6. In this embodiment, the voltage slew control is as described above with reference to FIG. 6, i.e., via the feedback through capacitor 1590. Current sense and amplification is done by transistor 1570 and associated resistors. Current slew feedback is done by capacitor 1560 which feeds directly to the common drive node 1640. In this embodiment, voltage and current slew rates are adjusted by a single element (capacitor 1590) and are thus in tandem.

Figure 11:
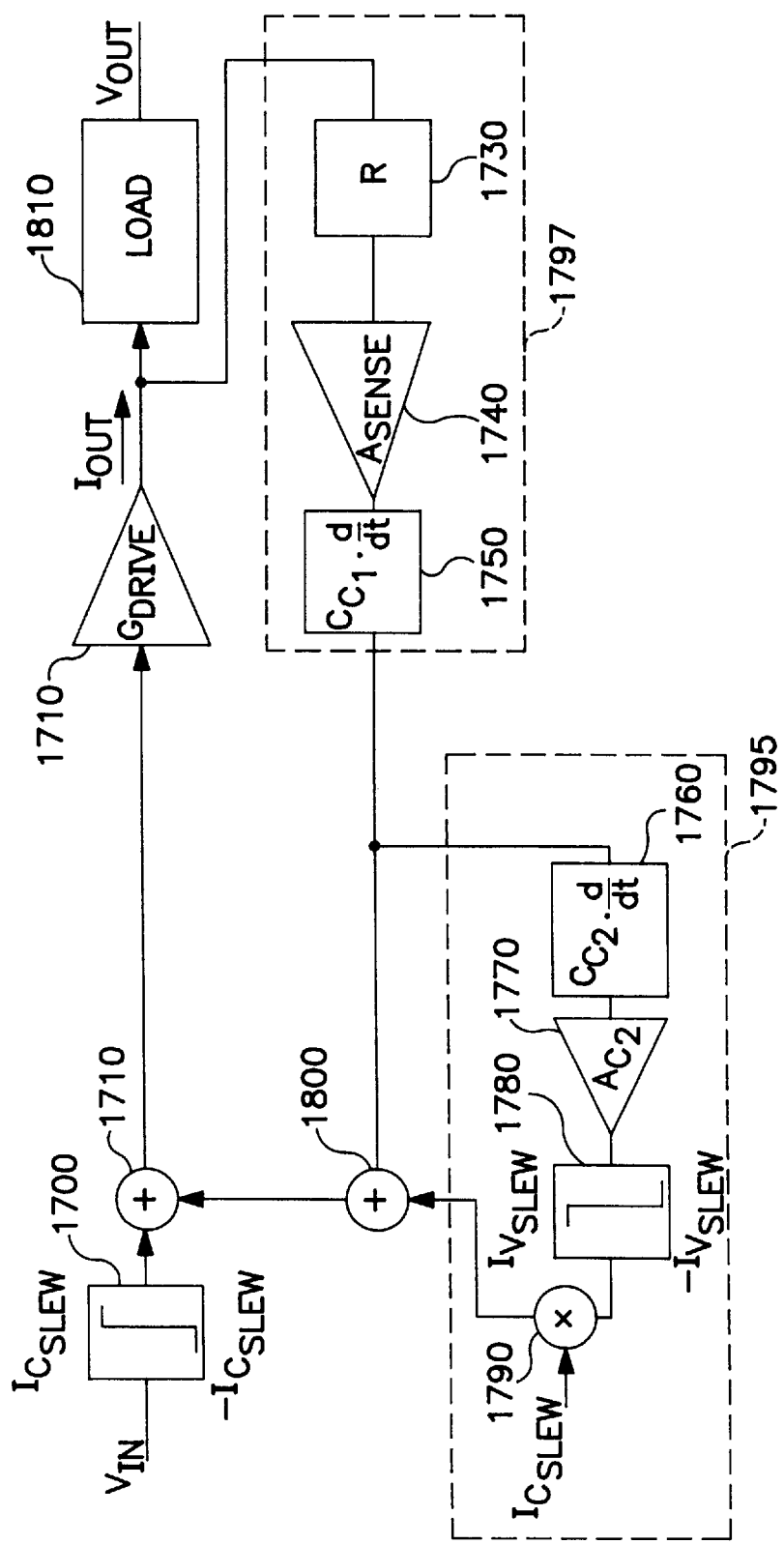
FIG. 11 shows an embodiment of a slew control circuit wherein voltage slew is controlled by the second derivative of the current.

To provide increased levels of control of the high frequency components of inductor current, higher order derivatives of current should be finite and well behaved. Since the voltage slew (dv/dt) across an inductor can be expressed $$\frac{dv}{dt} = L \cdot \frac{d^2 i}{dt^2}$$

it follows that the voltage slew across the inductor can be controlled by controlling the second derivative of the current. Therefore, inductor current harmonics can be further dampened by softening the corners of the current transitions by controlling the second derivative of inductor current, as shown in FIG. 11, using second derivative loop 1795 coupled to current slew control feedback loop 1797. In effect, second derivative loop 1795 slews the current slew control feedback signal from current slew control feedback loop 1797. This adds an additional 20 db roll-off that is of more use at higher frequencies. The second derivative $(d^2i/dt^2)$ indicates the rate of change in the first derivative (di/dt), and therefore is a good indicator of how sharp the transitions are. A voltage slew feedback loop is not required. As an added benefit, controlling voltage slew across the inductor reduces parasitic capacitance ($C_{Qparasitic}$, $C_{Lparasitic}$) currents which can produce additional noise components. Thus, for an inductive load, it is desirable not only to control the current slew (di/dt) but also to control the second derivative of the current. Controlling the voltage slew (dv/dt) controls the second derivative of the current and also helps to reduce parasitic component additions to high frequency noise.

Figure 12:
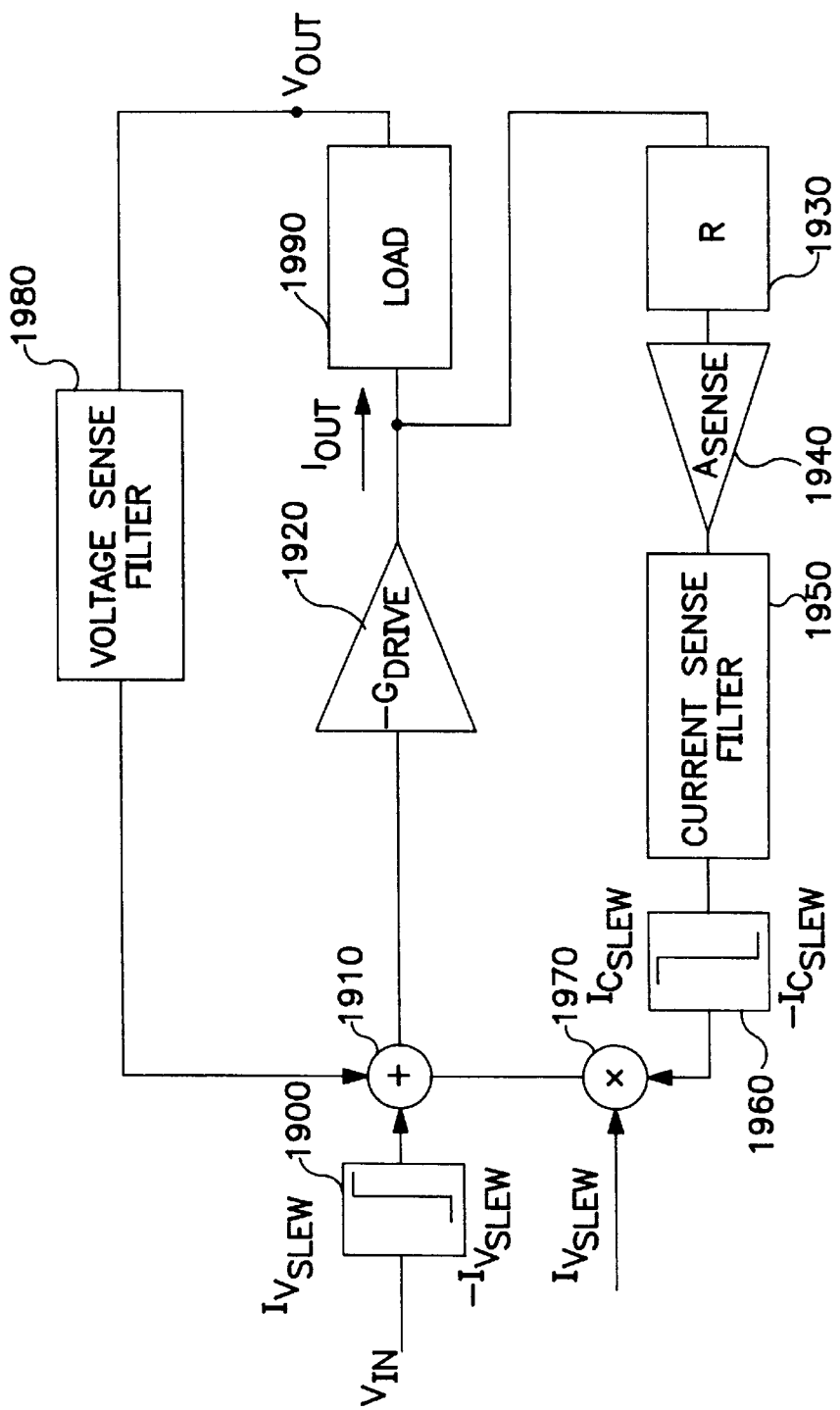
FIG. 12 shows an embodiment of a circuit which uses higher order slew control.

Increased reduction of high frequency signal harmonics can be obtained by controlling higher order derivatives of the signal (for example the Mth derivative of the output voltage and the Nth derivative of the output current), as shown in FIG. 12. The general expressions for the voltage and current slew signals are respectively $$\sum_n A_n \frac{d^n i}{dt^n} \text{ and } \sum_m B_m \frac{d^m v}{dt^m}.$$

For these waveforms not only is the first derivative finite and controlled but higher order derivatives are finite and controlled, thereby eliminating abrupt transitions in the waveforms. One way of doing this is by creating different feedback filters in a dual feedback loop method. Another way would be to generate a tanh (hyperbolic tangent) shaped waveform in an open loop system.

The embodiments of the present invention described above use output voltage and output current derivatives as feedback to control harmonics. However, the present invention is not limited to using feedback. It is possible to use first and higher order derivatives of output voltage and output current in an open loop method whereby a drive signal is amplified and applied directly to the load, as shown in FIG. 13.

Thus, it is seen that an apparatus and a method for using waveform shaping to reduce high frequency noise from switching inductive loads is provided. One skilled in the art will appreciate that the present invention can be practiced by other than the described embodiments, which are presented for the purposes of illustration and not of limitation, and the present invention is limited only by the claims which follow.

What is claimed is:

1. A low-noise switching regulator for driving an inductive load, said switching regulator including control circuitry responsive to current and voltage slew signals, wherein said control circuitry comprises:
    a driver coupled to said load;
    a current slew control feedback loop coupled to said driver for providing feedback based on the rate of change of load current to said driver; and
    a voltage slew control feedback loop coupled to said load for providing feedback based on the rate of change of the voltage across said load to said driver.

2. The low-noise switching regulator of claim 1 wherein, for positive integers M and N greater than or equal to 1:
    said voltage slew control feedback loop generates a first feedback signal which is proportional to the sum of one or more of the derivatives from 1 to M of the voltage across said load, and
    said current slew control feedback loop generates a second feedback signal which is proportional to the sum of one or more of the derivatives from 1 to N of the current through said load.

3. The low-noise switching regulator of claim 1 wherein:
    a drive voltage, the output of said current slew control feedback loop and the output of said voltage slew control feedback loop are summed to form the input to said driver.

4. The low-noise switching regulator of claim 3 wherein:

said load is coupled between a signal node and an output node, said current slew control feedback loop includes an input which is coupled to said signal node, and said voltage slew control feedback loop includes an input which is coupled to said output node.

5. The low-noise switching regulator of claim 4 wherein said driver comprises a drive amplifier.

6. The low-noise switching regulator of claim 4 wherein said voltage slew control feedback loop comprises a differentiating amplifier.

7. The low-noise switching regulator of claim 4 wherein said current slew control feedback loop comprises:

a sense amplifier coupled to said signal node through a resistor; and a differentiating amplifier coupled to said sense amplifier.

8. The low-noise switching regulator of claim 7 wherein:

said drive voltage has an amplitude which has an absolute value which is limited to a first value;

said differentiating amplifier has an output which has an absolute value which is limited to a second value;

the output of said differentiating amplifier is multiplied by a third value, said third value equal to said first value divided by said second value.

9. The low-noise switching regulator of claim 1 where voltage slew control is achieved by controlling the second derivative of the current through said load.

10. The low-noise switching regulator of claim 1 wherein said switching regulator comprises:

a driver coupled to said load;

a current slew control feedback loop coupled to said load; and a second derivative loop coupled to and combined with the output of said current slew control feedback loop.

11. The low-noise switching regulator of claim 1 wherein said switching regulator comprises an open loop control system.

12. A low-noise switching regulator for driving an inductive load, wherein said switching regulator comprises:

a driver which comprises a switch with a switch input terminal and a switch output terminal, said switch input terminal coupled to said load;

a current slew control feedback loop coupled to said switch output terminal; and a voltage slew control loop coupled to said switch output terminal.

13. The low-noise switching regulator of claim 12, wherein:

said switch further comprises a switch control terminal;

said driver further comprises a buffer amplifier coupled in series between a drive node and said switch control terminal;

said current slew control feedback loop comprises:

a resistor coupled between said switch output terminal and ground;

a sense amplifier with a first input coupled to said switch output terminal and a second input coupled to ground;

a first capacitor coupled between the output of said sense amplifier and a current slew control feedback node;

a first transconductance amplifier with a negative input coupled to said current slew control feedback node, a positive input coupled to a supply of reference potential and an output coupled to said current slew control feedback node; and a second transconductance amplifier with a first input coupled to said current slew control feedback node, a second input coupled to said supply of reference potential and an output coupled to said drive node; and said voltage slew control loop comprises a second capacitor coupled between said load and said drive node.

14. The low-noise switching regulator of claim 13 further comprising:

a third transconductance amplifier with a first input coupled to supply of drive voltage, a second input coupled to said supply of reference potential and an output coupled to said drive node.

15. A low-noise switching regulator for driving an inductive load coupled between a signal node and an output node, said switching regulator comprising:

a drive node;

an summer with a first summer input, a second summer input, a third summer input and an summer output;

a first limiter coupled between said drive node and said first summer input;

a multiplier with an output coupled to said third summer input;

a first differentiating amplifier with an input coupled to said output node and an output coupled to said second summer input;

a sense amplifier comprising an output, said sense amplifier coupled to said signal node through a resistor;

a second differentiating amplifier comprising an output, said second differentiating amplifier coupled to said output of said sense amplifier;

a second limiter comprising an output, said second limiter coupled to said output of said second differentiating amplifier, said output of said second limiter coupled to the input of said multiplier;

and a drive amplifier with an input coupled to said summer output and an output coupled to said signal node.

16. The low-noise switching regulator of claim 15 wherein:

said first limiter limits the absolute value of the amplitude of said drive voltage to a first value;

said second limiter limits the absolute value of the output of said differentiating amplifier to a second value;

said multiplier multiplies the output of said differentiating amplifier by a third value.

17. The low-noise switching regulator of claim 16, wherein said third value is equal to said first value divided by said second value.

18. A method for controlling a switching regulator for using a drive voltage to drive an inductive load, said load coupled between a signal node and an output node, for positive integers M and N greater than or equal to 1, said method comprising the steps of said method comprising the steps of:

generating a first feedback signal which is proportional to the Mth derivative of the voltage across said load;

generating a second feedback signal which is proportional to the Nth derivative of the current through said load;

combining said first and second feedback signals with said drive voltage to drive said load.

19. A method for controlling a switching regulator for using a drive voltage to drive an inductive load, said load coupled between a signal node and an output node, said method comprising the steps of:

slewing said signal node current to generate a first feedback signal;

slewing said first feedback signal to generate a second feedback signal; and combining said first and second feedback signals with said drive voltage to drive said load.

* * * * *